United States Patent [19]

Buckland

[11] Patent Number: 4,987,417
[45] Date of Patent: Jan. 22, 1991

[54] ADAPTIVE REFERENCING ANALOG-TO-DIGITAL CONVERTER

[75] Inventor: Dennis J. Buckland, Bethpage, N.Y.

[73] Assignee: Grumman Aerospace Corporation, Bethpage, N.Y.

[21] Appl. No.: 485,627

[22] Filed: Feb. 27, 1990

[51] Int. Cl.⁵ .............................................. H03M 1/36
[52] U.S. Cl. ...................................... 341/159; 341/155
[58] Field of Search ................................. 341/155, 159

[56] References Cited

U.S. PATENT DOCUMENTS 4,533,903  8/1985  Yamada et al. ....................... 341/159
4,559,522  12/1985  Sekino et al. ........................ 341/159

OTHER PUBLICATIONS

"Linear Electronic Analog/Digital Conversion Architectures, Their Origins, Parameters, Limitations, and Applications", By Bernard M. Gordon, IEEE Transactions on Circuits and Systems, vol. CAS-25, No., Jul. 1978.

Primary Examiner—William M. Shoop, Jr.
Assistant Examiner—Helen Kim
Attorney, Agent, or Firm—Pollock, Vande Sande & Priddy

[57] ABSTRACT

To provide for a higher speed operation, lower cost and less complexity in terms of manufacturing, the present invention analog-to-digital converter has feedforwards, from the more significant comparators, to the less significant comparators. As the respective outputs of the comparators change state, the voltage representing that state, for that comparator, is fed to succeeding less significant comparators. With the exception of the most significant comparator whose reference bias voltage remains static, the respective bias voltages of the rest of the successive less significant comparators are shifted, either higher or lower, as the output states of their predecessor comparator(s) change. Consequently, the respective outputs of the comparators correspond, in a binary progressive manner, to a digital word that is representative of the voltage of an input analog signal.

13 Claims, 5 Drawing Sheets

| OUTPUT VOLTAGE | | | THRESHOLD BIAS VOLTAGES | | | |
|---|---|---|---|---|---|---|
| Comp 3 | Comp 2 | Comp 1 | Comp 3 | Comp 2 | Comp 1 | Comp 0 |
| Vol | Vol | Vol | Vfs/2 | Vfs/4 | Vfs/8 | Vfs/16 |
| Vol | Vol | Voh | Vfs/2 | Vfs/4 | Vfs/8 | 3Vfs/16 |
| Vol | Voh | Vol | Vfs/2 | Vfs/4 | 3Vfs/8 | 5Vfs/16 |
| Vol | Voh | Voh | Vfs/2 | Vfs/4 | 3Vfs/8 | 7Vfs/16 |
| Voh | Vol | Vol | Vfs/2 | 3Vfs/4 | 5Vfs/8 | 9Vfs/16 |
| Voh | Vol | Voh | Vfs/2 | 3Vfs/4 | 5Vfs/8 | 11Vfs/16 |
| Voh | Voh | Vol | Vfs/2 | 3Vfs/4 | 7Vfs/8 | 13Vfs/16 |
| Voh | Voh | Voh | Vfs/2 | 3Vfs/4 | 7Vfs/8 | 15Vfs/16 |

FIG. 3

| | OUTPUT STATES | | | |
|---|---|---|---|---|
| | Comp 3 | Comp 2 | Comp 1 | Comp 0 |
| 0 | 0 | 0 | 0 | 0 |
| 1 | 0 | 0 | 0 | 1 |
| 2 | 0 | 0 | 1 | 0 |
| 3 | 0 | 0 | 1 | 1 |
| 4 | 0 | 1 | 0 | 0 |
| 5 | 0 | 1 | 0 | 1 |
| 6 | 0 | 1 | 1 | 0 |
| 7 | 0 | 1 | 1 | 1 |
| 8 | 1 | 0 | 0 | 0 |
| 9 | 1 | 0 | 0 | 1 |
| 10 | 1 | 0 | 1 | 0 |
| 11 | 1 | 0 | 1 | 1 |
| 12 | 1 | 1 | 0 | 0 |
| 13 | 1 | 1 | 0 | 1 |
| 14 | 1 | 1 | 1 | 0 |
| 15 | 1 | 1 | 1 | 1 |

ADAPTIVE REFERENCING ANALOG-TO-DIGITAL CONVERTER

FIELD OF THE INVENTION

The present invention relates to analog-to-digital converters and more particularly to an electronic circuit for converting a continuously varying analog input signal or voltage into a discrete digital output signal or word.

BRIEF DESCRIPTION OF THE PRIOR ART

In a paper published in the IEEE TRANSACTIONS ON CIRCUITS AND SYSTEMS, VOL. CAS-25, NO. 7, JULY 1978 entitled "Linear Electronic Analog/Digital Conversion Architectures, Their Origins, Parameters, Limitations, and Applications", a variety of A/D converter techniques and variations thereof were given. Tables IV and V of the paper list significant U.S. patents which relate to A/D converter techniques.

The most widely used architecture for high speed A/D conversion is the parallel threshold method. In this method, the input signal is applied in parallel to a multiplicity of comparators. Each comparator is referenced to a potential derived from a reference voltage by a resistor divider to effect a comparator level for each possible quantization level. Thus, all comparators referenced to quantization levels below an arbitrary level of an input signal will be actuated, while all comparators referenced to quantization levels above the arbitrary level of the input signal will not be. The outputs of all the comparators are applied to a decoding logic to yield the parallel output code. Such A/D converter is extremely fast, as it is limited in speed only by the reaction time of the comparators and the decoding logic. Yet, the amount of components required for such A/D converter rises exponentially with the number of bits encoded.

The resolution of single step flash converters is limited to about 8-bits and, moreover, results in high power dissipation. Putting it differently, if n is the number of output bits, a flash converter requires $2^{n-1}$ comparators, $2^{n-1}$ resistors, and up to $$\sum_{k=2}^{n} (2^k - 2)$$

logic gates, or a total of approximately 1000 circuit elements for 8-bit resolution. Needless to say, the manufacturing costs for such A/D converters is high, and becomes exponentially greater as the requirement for the bit resolution increases.

For high resolution conversion, the total amount of circuitry can be reduced by sequencing two of the above-discussed arrangements wherein the most significant bits are first "flash encoded." The encoded most significant bits are then converted via a high speed digital-to-analog (D/A) converter to a potential representing those most significant bits, and subtracted from the input. The difference between the input signal and the potential is scaled, and the result flash encoded in a similar circuit to yield the least significant bits in the output data word. Such a "two-step" parallel thresholding A/D converter architecture, unfortunately, still has the disadvantage of an increase in circuit complexity.

BRIEF DESCRIPTION OF THE PRESENT INVENTION

The adaptive referencing A/D converter of the present invention, instead of using the static reference ladder (of the parallel threshold method) which biases each one of the $2^{n-1}$ comparators at successively higher quantization levels, uses a dynamic referencing scheme. The bias voltage or threshold on each one of the $n-1$ comparators is determined via feedforward by the output of the higher order comparators and is, in effect shifted or changed, based on the state of the other comparators.

The dynamic referencing scheme for the present invention converter has its most significant comparator being biased at a static voltage. Each of the remaining successively less significant comparators is also voltage biased, but at decreasing quantized values. Respective feedforward circuits connect the output of each comparator, except for the least significant comparator, to the voltage biasing circuits of every less significant comparator. Thus, any variation in the input analog signal, provided that the variation is sufficiently large, shifts the threshold bias voltages, and produces a corresponding digital signal in the form of outputs from the comparators. The number of comparators in the converter corresponds to the desired number of bits of resolution. And in view of the feedforward biasing circuitry, for 8-bit resolution, which requires eight comparators, a total of 52 elements are required. This compares favorably to the approximately 1000 circuit elements required for a similar 8-bit resolution prior art parallel threshold converter. In addition, the speed of the present invention A/D converter is limited only by the response time of its comparators.

It is, therefore, an objective of the present invention to provide an A/D converter that allows high resolution and high speed analog-to-digital conversion, at a lower power dissipation and cost than the prior art parallel threshold converter.

BRIEF DESCRIPTION OF THE FIGURES

The above-mentioned objectives and advantages of the present invention will become more apparent and the invention itself will be best understood by reference to the following description of an embodiment of the invention taken in conjunction with the accompanying drawings, wherein.

DETAILED DESCRIPTION OF THE PRESENT INVENTION

Figure 1:
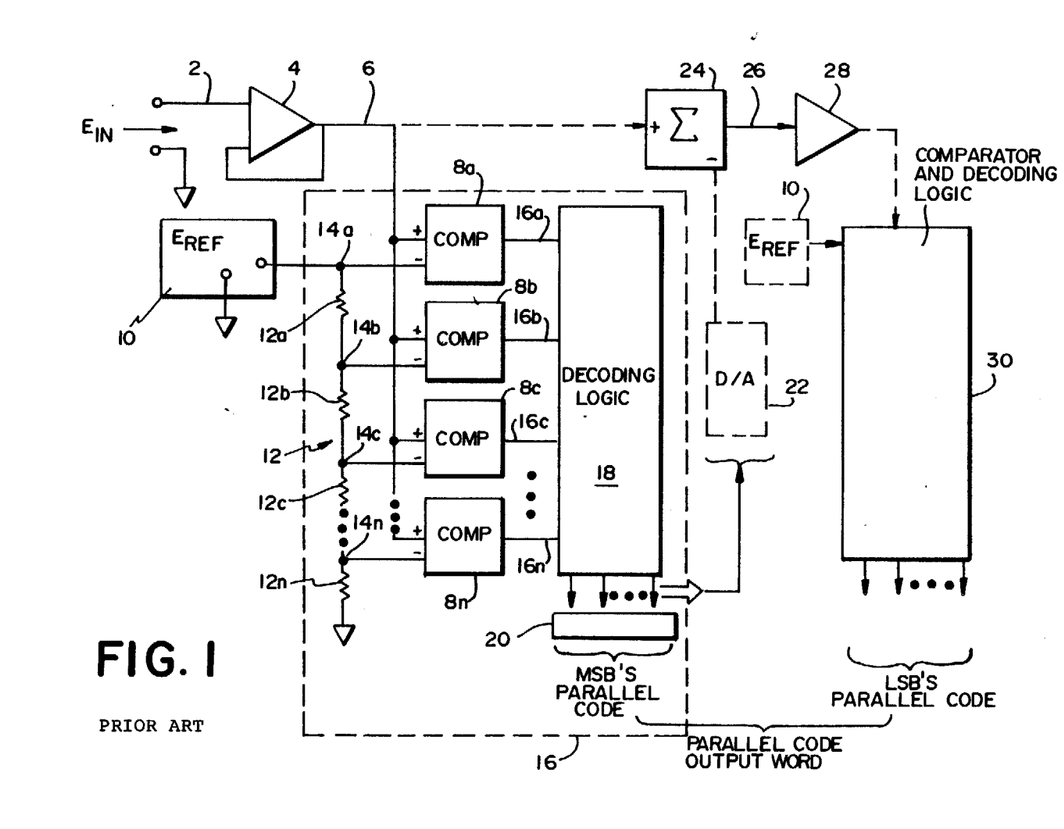
FIG. 1 is a simple schematic of a prior art parallel threshold A/D converter.

With reference to FIG. 1, there is shown a prior art so called n-bit parallel threshold analog-to-digital (A/D) converter having the ability to both "single flash" and "double flash." As shown, an input voltage EIN is provided at input 2 of a voltage follower 4, used to buffer the input voltage so that a plurality of components may be driven thereby. The output from voltage follower 4 is fed, by means of line 6, to a plurality of comparators, of which only 8a, 8b, 8c and 8n are shown in the FIG. 1 illustration. These comparators are conventional electronic components where ideally each has an infinite input impedance, nearly zero output impedance and saturated output.

Each of the comparators has a positive (noninverting) input and a negative (inverting) input. These comparators may be formed from operational amplifiers each of which, if its positive input is greater than its negative input, has an output state of one, conventionally represented by positive +5 volts. Also fed to comparators 8a to 8n is a reference voltage 10, which is a stable voltage that corresponds to a full scale maximum voltage which, for example, may have a value of 10 volts. A voltage divider ladder 12, which is grounded and comprises $2^n$ resistors, provides the reference voltage to the respective comparators, more specifically to the respective negative, or inverting, inputs of the comparators. For reference, comparator 8a is deemed to be of the most significant, or is to have the highest order; whereas comparator 8n is deemed to be the least significant, or have the lowest order.

When an input analog voltage is applied to line 2, buffered by voltage follower 4, and provided to the non-inverting inputs of the respective comparators through line 6, the respective reference voltages at the inverting inputs of the corresponding comparators, such as at node 14a to 14n, are biased to incrementally decreasing quantized values, so that all the comparators which have reference bias voltages that are greater than the input voltage will have an output of zero, or a low value voltage, at their respective outputs 16a to 16n.

Putting it differently, consider the following. Assume that the reference voltage is 10 volts. Accordingly, there is a 5 volt bias voltage half way down voltage divider ladder 12. Further assumed that half way down the ladder is comparator 8c, with reference bias voltage of 5 volts at node 14c. Under this scenario, if an analog input voltage is slightly greater than 5 volts, comparators 8c and 8n will be turned on and have output states of one (1), or 5 volts. At the same time, since comparators 8a and 8b have respective reference bias voltages that are presumably greater than the input analog voltage, these comparators will remain off, and thereby have an output of zero (0), or very low voltage.

Since a flash converter, such as that shown in FIG. 1 and surrounded by the dotted box 16, requires $2^n-1$ comparators, in order to obtain a digital word that is encoded in normal binary progression, a decoding logic 18, single flash converter, it follows then that if 8-bit resolution is required, a total of 255 comparators (resulting from $2^8-1$) are needed, in order to provide inputs to decoding logic 18, so that an 8-bit word is output therefrom. For any resolution greater than 8, such a single flash converter becomes extremely complex.

In an effort to get a higher resolution, a two step flash converter is used. Basically, such a two step flash converter uses the same architecture as the single flash converter, but would use the single flash converter to convert the most significant portion of the input signal. For example, with reference again to FIG. 1, ultimately wanting to have an output of 12-bits, the most significant 6-bits are first encoded exactly as was described with respect to the dotted box 16. The output from the decoding logic 18 is then stored in a latch 20, and converted back to an analog signal, by means of a digital-to-analog (D/A) converter 22, and fed to a summer 24. The analog voltage from D/A converter 22 is next subtracted from the input analog voltage (from line 6) in summer 24. Recognize that the output from D/A converter 22 is always less than the input analog voltage from line 6, since only the most significant bits are taken into account.

From summer 24 a difference voltage, which is the difference between the input analog voltage and the voltage from D/A converter 22, is provided via line 26 to a scaling amplifier 28, where it is scaled by $2^n$ to enable conversion using reference voltage 10 provided to comparators and decoding logic in circuit 30 similar to those of dotted box 16. The outputs from comparator and decoding logic circuit 30 become the lower significant bits which, in the FIG. 1 embodiment, are combined with the most significant bits output from decoding logic 18 to provide for the required 12-bit output. The number of components in such a 12-bit two step flash converter is large and the circuitry thereof is extremely complex.

Figure 2:
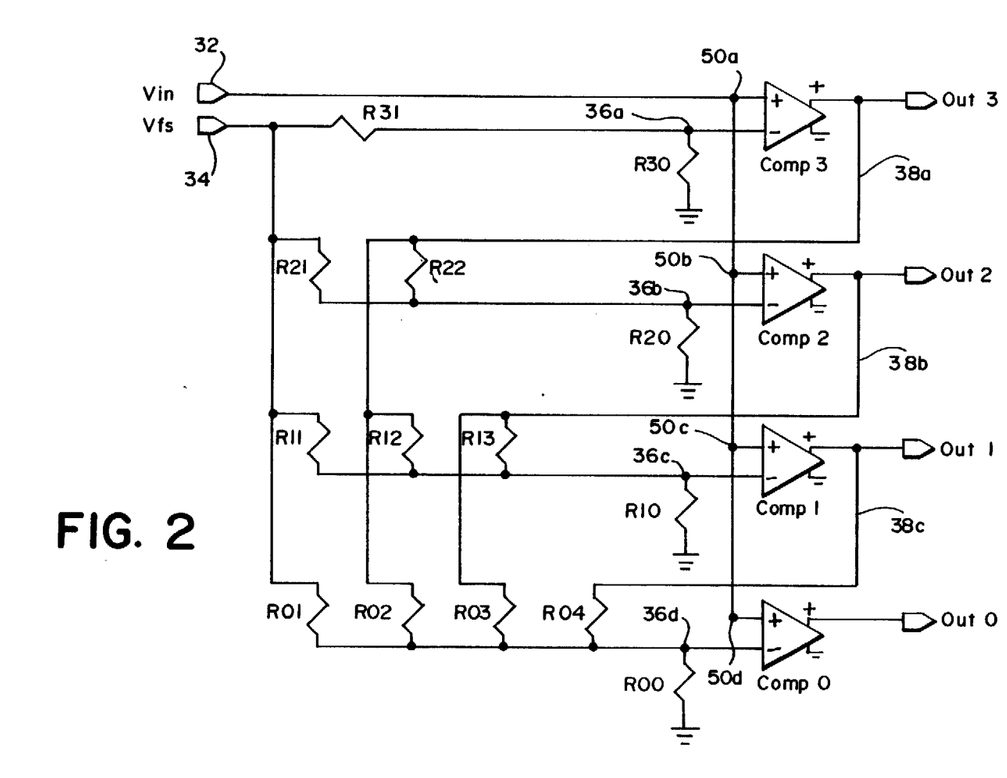
FIG. 2 is a schematic of the present invention A/D converter with 4-bit resolution.

For the sake of simplicity in illustration, only a 4—bit A/D converter of the present invention is shown in FIG. 2. For the FIG. 2 converter, the comparators are designated Comp3, Comp2, Comp1, and Comp0. An input analog voltage, at 32, is supplied to the respective noninverting inputs of each of the comparators. But instead of having a single resistor ladder biasing the comparators, the reference voltage at 34, which is the full scale reference voltage Vfs, is fed to the different comparators, by means of respective voltage divider networks. Just like the comparators of the prior art parallel threshold A/D converters, the comparators of the FIG. 2 embodiment are conventional electronic components characterized by high impedance differential inputs and low impedance saturating outputs, swinging between two logic levels. For each comparator, when the voltage at the non-inverting input exceeds the voltage at the inverting input, the output becomes a high logic level Voh; when the opposite happens, the output becomes a low logic level Vol.

For the embodiment illustrated in FIG. 2, comparator Comp3 is the most significant comparator, Comp2 the second most significant, Comp1 the third most significant, and Comp0 the least significant. In others words, for the successive comparators shown in FIG. 2, each succeeding one has less significance than its predecessor. Likewise, comparator Comp3 may be considered as being to be the highest order comparator while comparator Comp0 may be considered as being the lowest order comparator.

For comparator Comp3, a voltage divider circuit comprising resistor R31 and R30 provides a bias voltage at node 36a, which is predetermined to have a level that is at half of the full scale level of voltage Vfs. The values of resistors R31 and R30 determine the value of the bias voltage. Thus, by using the following voltage dividing equation $$\frac{Vfs - Vfs/2}{R31} + \frac{0 - Vfs/2}{R30} = 0, \quad (1)$$

and arbitrarily choosing R30 to be 8k ohms, resistor R31 is found to be 8K ohms. The bias voltage at node 36a remains static at half of the Vfs voltage, with the output from comparator Comp3 being provided at Out3. Similar to comparator Comp3, the other comparators Comp2, Comp1, and Comp0 have respective voltage divider circuits for providing corresponding reference bias voltages at respective nodes 36b, 36c and 36d.

Further shown in FIG. 2 is that the output of comparator Comp3 is fed forward to each of the succeeding less significant comparators. To wit, a feedforward circuit 38a links the output of comparator Comp3 to the voltage divider circuit of comparator Comp2 by means of resistor R22, to the voltage divider circuit of comparator Comp1 via resistor R12, and the voltage divider circuit of comparator Comp0 via resistor R02. The output of comparator Comp2, likewise, is fed back to the respective voltage divider circuits of comparators Comp1 and Comp0, via resistors R13 and R03, respectively. Similarly, the output of comparator Comp1, via line 38c, is connected to the divider circuit of comparator Comp0, though R04.

For the FIG. 2 embodiment, the bias voltage of the second most significant comparator, i.e. comparator Comp2, is chosen to be $\frac{1}{4}$ of VFS, when the output of comparator Comp3 is low, or Vol. When the output of Comp3 is high, designated Voh, the bias voltage for comparator Comp2, at node 36b, becomes $\frac{3}{4}$ of voltage Vfs. This is due to the fact that, with the high state output of 5 volts from comparator Comp3 being fed to the divider voltage circuit of comparator Comp2 via resister R22, the values of resistors R20, R21, as well as R22, are all used to determine the bias voltage. The following equations provide these values.

$$\frac{Vfs - Vfs/4}{R21} + \frac{Vol - Vfs/4}{R22} + \frac{0 - Vfs/4}{R20} = 0 \quad (2)$$

$$\frac{Vfs - 3Vfs/4}{R21} + \frac{Voh - 3Vfs/4}{R22} + \frac{0 - 3Vfs/4}{R20} = 0 \quad (3)$$

For this example, if Vol=0 volts and Voh=Vfs, and if R20 is arbitrarily chosen to be 8k ohms, then R21 becomes 8k ohms and R22 4k ohms.

For comparator Comp 1, the bias voltage is chosen to be $\frac{1}{8}$ of Vfs when the output of Comp3 and Comp2 is low (Vol.); $\frac{3}{8}$ of Vfs when the output of comparator Comp3 is low (Vol) and the output of comparator Comp2 is high (Voh); and $\frac{5}{8}$ of Vfs when the output of comparator Comp3 is high, at Voh, and that of comparator Comp2 is low, at Vol. The values of resistors R11, R12, R13 and R10 together provide the value of the bias voltage at node 36c. The following equations provide the values of those resistors.

$$\frac{Vfs - Vfs/8}{R11} + \frac{Vol - Vfs/8}{R12} + \frac{Vol - Vfs/8}{R13} + \quad (4)$$

$$\frac{0 - Vfs/8}{R10} = 0$$

$$\frac{Vfs - 3Vfs/8}{R11} + \frac{Vol - 3Vfs/8}{R12} + \frac{Voh - 3Vfs/8}{R13} + \quad (5)$$

$$\frac{0 - 3Vfs/8}{R10} = 0$$

$$\frac{Vfs - 5Vfs/8}{R11} + \frac{Voh - 5Vfs/8}{R12} + \frac{Vol - 5Vfs/8}{R13} + \quad (6)$$

$$\frac{0 - 5Vfs/8}{R10} = 0$$

With equation 4, 5 and 6, assuming that the output states of the comparators, when low, is 0 volts, and when high, is equal to the reference voltage Vfs, and if R10 is arbitrarily chosen to be 8K ohms, then resistor R11 can be shown to be 8k ohms, R12 4k Ohms, and R13 2k ohms.

Following the same procedure, for the least significant comparator Comp0, with 1/16 of reference voltage Vfs being chosen to be the bias voltage at node 36d when the respective outputs of comparators Comp3, Comp2, and Comp1 are low at Vol; 3/16 of the Vfs when the respective outputs of Comp3 and Comp2 are low at Vol and the output of Comp1 is high at Voh; 5/16 of Vfs when the outputs of comparators Comp3 and Comp1 are low at Vol and the output of comparator Comp2 is high at Voh; and 9/16 of Vfs when the output of comparator Comp3 is high at Voh and the outputs of comparators Comp2 and Comp1 are low at Vol. The values of resistors R01, R02, R03, R04 and R00 together determine the bias voltage at node 36d. The following equations provide the values for those resistors.

$$\frac{Vfs - Vfs/16}{R01} + \frac{Vol - Vfs/16}{R02} + \frac{Vol - Vfs/16}{R03} + \quad (7)$$

$$\frac{Vol - Vfs/16}{R04} + \frac{0 - Vfs/16}{R00} = 0$$

$$\frac{Vfs - 3Vfs/16}{R01} + \frac{Vol - 3Vfs/16}{R02} + \frac{Vol - 3Vfs/16}{R03} + \quad (8)$$

$$\frac{Voh - 3Vfs/16}{R04} + \frac{0 - 3Vfs/16}{R00} = 0$$

$$\frac{Vfs - 5Vfs/16}{R01} + \frac{Vol - 5Vfs/16}{R02} + \frac{Voh - 5Vfs/16}{R03} + \quad (9)$$

$$\frac{Vol - 5Vfs/16}{R04} + \frac{0 - 5Vfs/16}{R00} = 0$$

$$\frac{Vfs - 9Vfs/16}{R01} + \frac{Voh - 9Vfs/16}{R02} + \quad (10)$$

$$\frac{Vol - 9Vfs/16}{R03} + \frac{Vol - 9Vfs/16}{R04} + \frac{0 - 9Vfs/16}{R00} = 0$$

Assuming the same parameters as before, that is, if the outputs of the respective comparators when at the low state is 0 volts and when at high state is Vfs of the reference voltage, and if R00 is arbitrarily chosen to be 8K ohms, then R01 is calculated to be 8K ohms, R02 4K ohms, R03 2K ohms, and R04 1K ohms.

Figure 5:
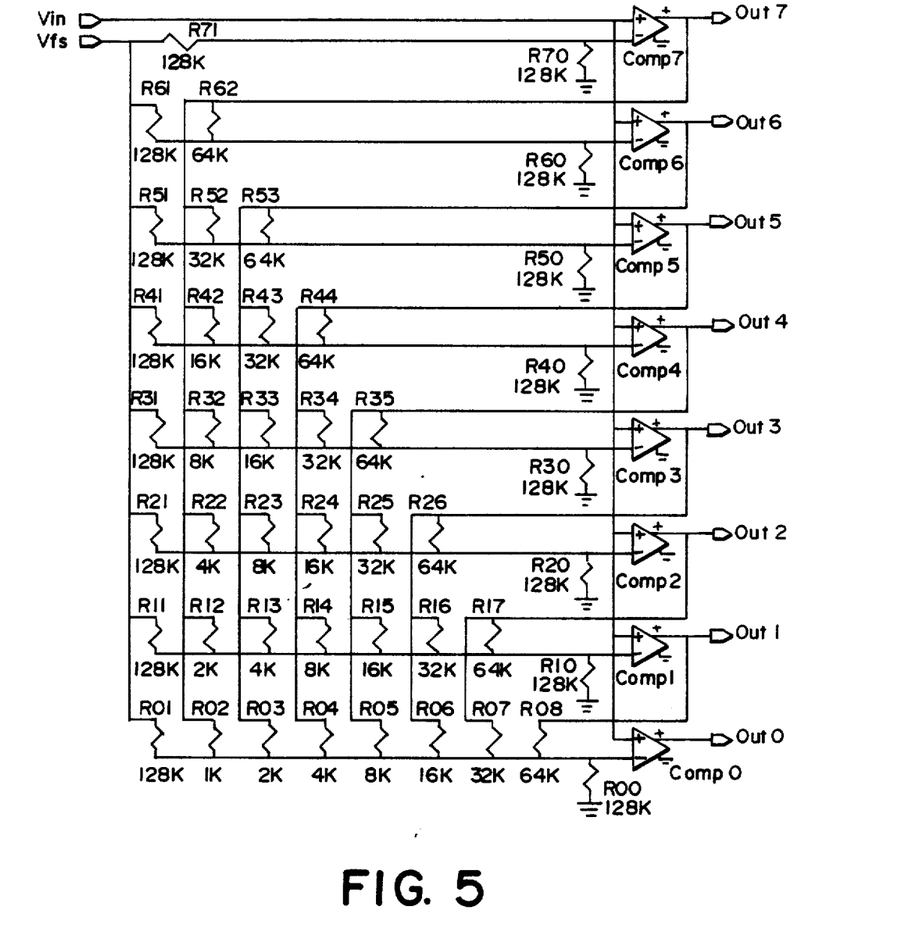
FIG. 5 is a schematic illustrating an A/D converter of the present invention which has eight comparators and, therefore, has 8-bit resolution.

This process can be continued ad infinitum, if the resolution of the present invention converter is to be increased to n bits, as for example, the 8-bit A/D converter shown in FIG. 5.

Having given the respective values of the resistors, it should be appreciated that an important advantage of the design of the present invention converter is that the actual values of the resistors are not important, so long as the ratio is accurate, when the different components are being manufactured, as for example, on an integrated circuit (IC) chip. Further, with the accurate ratio being provided to the different resistors, a nice tracking property results, since each of the resistors is shifted the same amount.

In operation, when the input analog voltage at 32 is 0, the bias voltage at node 36a is $\frac{1}{2}$ the full scale voltage Vfs. The respective bias voltages at node 36b, 36c, and 36d are $\frac{1}{4}$, $\frac{1}{8}$, and 1/16 of full scale reference voltage Vfs. These values are respectively illustrated on the first row of the columns under the heading Threshold Bias Voltages in the Table of FIG. 3.

Figure 4:
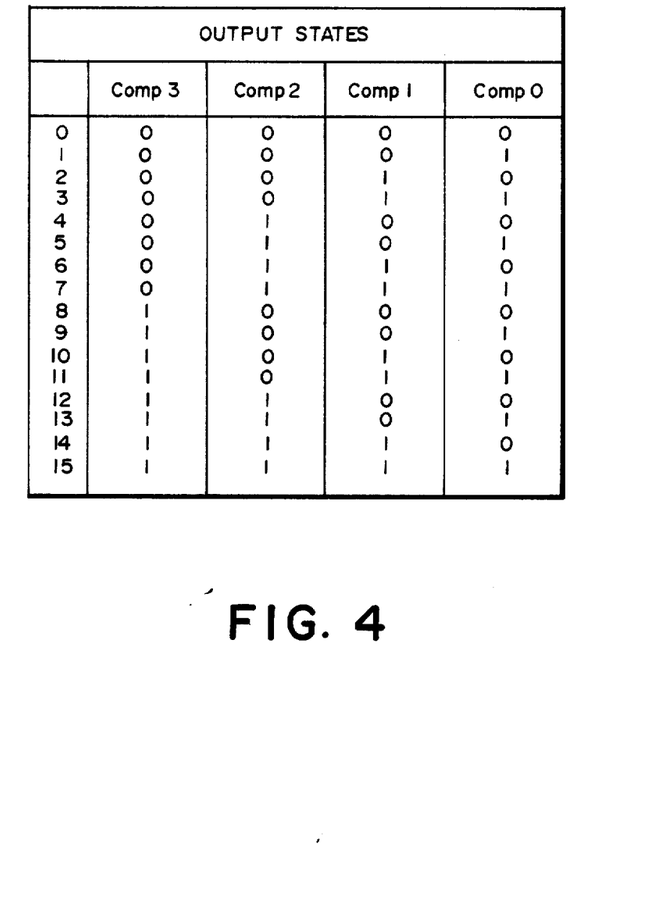
FIG. 4 is a table illustrating the possible output states of the FIG. 2 A/D converter.

As the amplitude of the input analog voltage at 32 starts to vary, for example increases to at least 1/16 or slightly above 1/16 of the reference voltage Vfs, assuming that the comparators will switch when the value at their non-inverting input is greater than their inverting inputs, the output of comparator 0 becomes a high logic state, i.e. changes to 1. At this point, the outputs of comparators Comp3, Comp2, Comp1, and Comp0 would register 0, 0, 0 and 1, respectively. If these outputs are taken to be the outputs of a digital signal, a number which is equivalent to 1, as shown in the leftmost column of FIG. 4, is provided.

Figure 3:
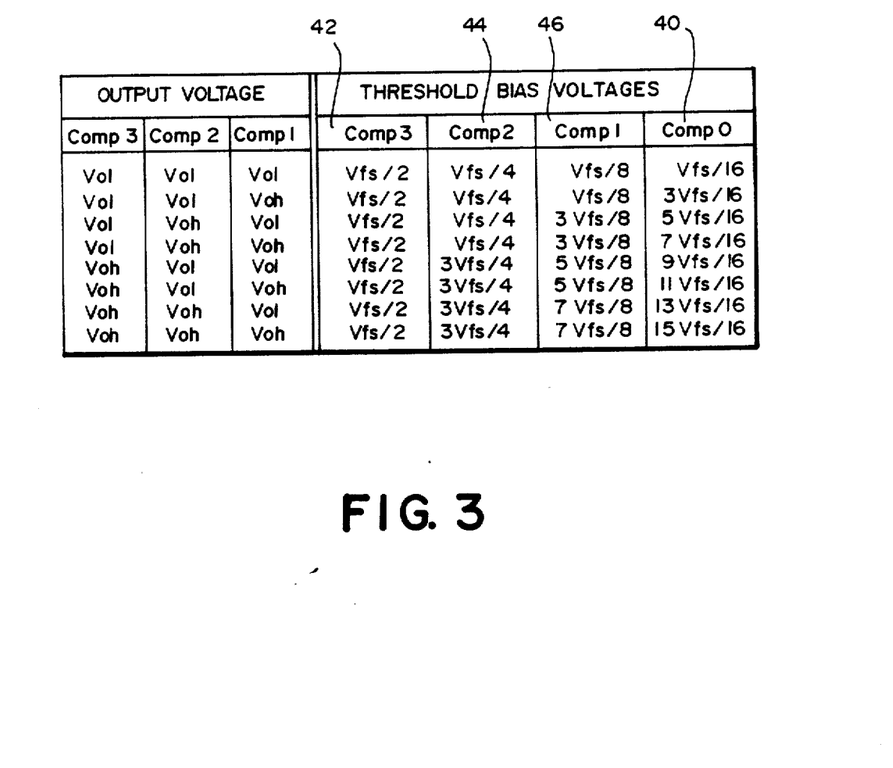
FIG. 3 is a graph illustrating both the output voltages at the three most significant comparators and the threshold bias voltages of all four comparators of the FIG. 2 embodiment.

As the voltage of input analog signal at 32 continues to increase and reaches slightly beyond ⅛ that of reference voltage Vfs at node 50c, comparator Comp1 goes from a low state (assuming at 0 volts) to a high or 1 state, which is assumed to be at 5 volts. At this point, this voltage is fed back to the divider circuit of comparator Comp0 through resistor R04, and through resistor R00 to ground, thereby pushing the reference bias voltage at node 36d from 1/16 to 3/16 that of reference voltage Vfs. And since the reference bias voltage at node 36d, at 3/16 of Vfs, is greater than the input analog voltage of ⅛ Vfs at node 50d, comparator Comp0 now switches from the high output state to a low output state. Consequently, outputs out3 to Out0 now register digitally 0010, representative of 2, as shown in FIG. 4. The respective threshold bias voltages of comparators Comp3 through Comp0, at respective reference bias nodes 36a to 36d, as shown in the second row of the heading entitled Threshold Bias Voltages of FIG. 3, are ½, ¼, ⅛ and 3/16 of Vfs at this stage. As comparator Comp0 is the least significant, or the lowest order, comparator, no feedback circuit is provided at its output.

For comparator Comp0, it can be seen that its voltage divider circuit is comprised of, in addition to R01 and R00, the feedforward resistors R02, R03 and R04 from comparators Comp3, Comp2 and Comp1, respectively. Thus, these feedforward resistors R02, R03 and R04 continuously shift the reference bias voltage at node 36d by alternately pulling up and pushing down the same, so that the reference bias voltage for comparator Comp0 is appropriate for the proper binary encoding.

Continuing with the analysis, assume now that the voltage of the analog input signal is now varied to exceed 3/16 of the reference voltage Vfs, comparator Comp0 would now switch from a low to high state, as illustrated in row 3 under heading Threshold Bias Voltages in FIG. 3. The outputs of the comparators therefore represent, in binary progression, the number 3, as shown in FIG. 4, where the outputs for comparators Comp3 and Comp2 are 0's while the outputs for comparators Comp1 and Comp0 are 1's.

As the voltage of the input analog signal continues to vary, for example increases and eventually rises slightly above ¼ that of reference voltage Vfs, comparator Comp2 would switch from a low output state to a high output state, in view of the reference bias voltage of ¼ Vfs at node 36b. At this point, the 5 volts at line 38b is fed forward through resistor R13 to the voltage divider circuit of comparator Comp1, thereby pulling the reference bias voltage at node 36c to ⅜ that of reference voltage Vfs. The 5 volts is also fed forward to the voltage divider circuit of comparator Comp0, via resistor R03, to thereby pull up the reference bias voltage for comparator Comp0 at node 36d to 5/16 that of reference voltage Vfs. Since the input voltage of the analog signal at nodes 50c and 50d remains the same as that at node 50b, i.e. at ¼ that of reference voltage Vfs, the respective outputs of comparators Comp1 and Comp0 at Out1 and Out0 are switched from the high to low state. The respective output states of comparator Comp3 to Comp0, at this stage, are 0100, represented digitally by the number 4, as shown in FIG. 4. The respective threshold bias voltages of the comparators at nodes 36a to 36d are shown in the third row under the heading Threshold Bias Voltages in FIG. 3.

It should be appreciated that, as the voltage of input analog signal at 32 increases linearly, the reference bias voltage at node 36d for comparators Comp0 also shifts linearly from 1/16 to 3/16, 5/16, 7/16, etc., as illustrated in column 40 of FIG. 3.

Continuing with FIG. 3, it should also be apparent that the reference bias voltage at node 36a, for comparator Comp3, remains static at ½ that of reference voltage Vfs, as indicated in the column designated 42. Similarly, it can be seen from the column designated 44 that the threshold bias voltage at node 36b of comparator Comp2 will change from ¼ to ¾ that of reference voltage Vfs. And from the column designated 46, the reference bias voltage at node 36c of comparators Comp1 is shown to change from ⅛ to ⅜, ⅝ and ⅞ of reference Vfs.

This analysis continues with respect to the feedforward of 5 volts from the outputs of comparators Comp3 to Comp1 to their respective succeeding less significant comparators. When the respective outputs are switched from low to high, different digital numbers, represented in binary as the output states are obtained. All possible output states of a 4-bit converter are shown in FIG. 4. And since the resistor divider networks for the present invention converter have been designed to produce the correct binary representation of the analog input, no decoding logic is required. It follows then that the number of resistors required, in both the voltage divider circuits and the feedforward circuits, is determined by the equation $$\left( \sum_{k=1}^{n} k \right) + n \tag{9}$$

where n = the number of comparators.

Since the present invention converter does not require any decoding logic, nor the separation of the more significant bits from the lesser significant bits as in the case of a two step flash converter, the speed of the present invention converter is limited only by the response time of the respective comparators. There results, therefore, a high resolution, high speed analog-to-digital converter which, because of the smaller number of components, consumes less power and can also be manufactured at a lower cost than prior art A/D converters.

Although only a 4-bit resolution A/D converter has been discussed with regard to FIGS. 2, 3 and 4, it should be appreciated that an A/D converter with a linearily greater number of comparators, for a higher resolution number of bits, can also be obtained. In fact, a 8-bit A/D converter with, therefore, 8-bit resolution, is shown in FIG. 5. The analysis of such 8-bit, and higher bit, A/D converter of the present invention does not deviate in principal from what was discussed with respect to the 4-bit embodiment of FIG. 2.

Inasmuch as the present invention is subject to many variations and modifications and changes in detail, it is intended that all matter described throughout this specification and shown in the accompanying drawings be interpreted as illustrative only and not in a limiting sense. Accordingly, it is intended that the invention be limited only by the spirit and scope of the appended claims.

I claim:

1. Circuit for converting a varying input analog voltage to a digital signal, comprising:
   a plurality of comparator means including a highest order comparator means and a lowest order comparator means, each comparator means capable of at least two output states;
   resistor means associated with each comparator means for establishing, from a reference voltage, a different bias voltage for each comparator means, the established bias voltages decreasing incrementally in value from the highest order comparator means to the lowest order comparator means;
   feedforward means associated with all but the lowest order comparator means for providing a feedforward to succeeding lower order comparator means so that the bias voltage of each succeeding lower order comparator means is shifted in response to a change in the output state of at least one of its preceding higher order comparator means;
   wherein the analog voltage is fed to each comparator means and compared with the respective bias voltages of the comparator means to provide at the output of each comparator means one of the two output states; and
   wherein any varying of the analog voltage is accompanied by a shifting of at least one of the respective bias voltages, other than the bias voltage of the highest order comparator means, for comparing the varied analog input voltage with the respective bias voltages of the comparator means to thereby convert the varied analog voltage into a corresponding digital signal represented by the output states of the respective comparator means.

2. The circuit of claim 1, wherein the comparator means comprises high impedance differential inputs and low impedance saturating outputs swinging between two logic levels.

3. The circuit of claim 1, wherein the resistor means comprises a voltage divider circuit for establishing the bias voltage for its associated comparator means at a value determined by the state of all higher order comparator means.

4. The circuit of claim 1, wherein each comparator means has one output whose output state is one of two choices, which is representative of the feedforward voltage.

5. The circuit of claim 1, wherein the number of comparator means corresponds to the number of bits of the digital signal.

6. The circuit of claim 1, wherein the resistor means and feedforward means comprise resistors; and wherein $$\left(\sum_{k=1}^{n} k\right) + n$$

resistors are required for the circuit where n is the number of comparator means in the circuit.

7. The circuit of claim 1, wherein the circuit comprises a total number of elements represented by $$\left(\sum_{k=1}^{n} k\right) + 2n$$

wherein n is the number of comparator means in the circuit.

8. Circuit for converting a varying input analog voltage to a corresponding digital signal, comprising:
   a plurality of successive comparators each succeeding one having less significance than its predecessor including a least significant comparator, each comparator capable of at least two output states;
   a plurality of voltage divider circuits each connected to a reference voltage and to one of the comparators for providing respective bias voltages to the comparators, the bias voltages having respective incrementally decreasing quantized values for each succeeding less significant comparator;
   wherein the analog voltage is fed to each comparator and compared with the respective bias voltages of the comparators to provide at the output of each comparator one of the two output states;
   a plurality of feedforward circuits each connecting the output of a corresponding comparator, except for the least significant comparator, to the voltage divider circuit of its at least one succeeding less significant comparator to provide a feedforward to adaptively change the bias voltage of the at least one succeeding less significant comparator when the output state of the corresponding comparator changes;
   wherein a sufficient variation of the analog voltage affects the bias voltage of at least one of the succeeding plurality of successive comparators so that the varied analog voltage is compared with the respective bias voltages including the at least one changed bias voltage to produce the respective comparator output states representative of the corresponding digital signal.

9. The circuit of claim 8, wherein the successive comparators comprise a most significant comparator having the highest value bias voltage and a least significant comparator having the lowest value bias voltage.

10. The circuit of claim 8, wherein each voltage divider circuit establishes the bias voltage for its corresponding comparator at a value determined by all predecessor comparators' outputs.

11. The circuit of claim 8, wherein the voltage divider circuits and feedforward circuits comprise resistors; and
    wherein the digital signal has a number of bits which is the same as the number of comparators.

12. The circuit of claim 8, wherein the number of comparators for the circuit is n; and
    wherein the number of resistors required for the circuit is $$\left(\sum_{k=1}^{n} k\right) + n.$$

13. The circuit of claim 8, wherein the circuit comprises a total number of elements represented by $$\left(\sum_{k=1}^{n} k\right) + 2n$$

wherein n is the number of comparator means in the circuit.

* * * * *

UNITED STATES PATENT AND TRADEMARK OFFICE
CERTIFICATE OF CORRECTION

PATENT NO. : 4,987,417
DATED : January 22, 1991
INVENTOR(S) : Dennis J. Buckland It is certified that error appears in the above-identified patent and that said Letters Patent is hereby corrected as shown below:

Column 3, line 54, after "18," insert --which has multiple digital gates, is needed. For the--.

Column 4, line 51, delete "to be".

Column 5, line 21, change "VFS" to --Vfs--.

Column 5, line 28, change "resister" to --resistor--.

Column 6, line 2, change "Ohms" to --ohms--.

Column 6, line 45, change "8K" to --8k--.

Column 6, line 46, change "8K" to --8k-- and change "4K" to --4k--.

Column 6, line 47, change "2K" to --2k-- and change "1K" to --1k--.

UNITED STATES PATENT AND TRADEMARK OFFICE
CERTIFICATE OF CORRECTION

PATENT NO. : 4,987,417

DATED : January 22, 1991

INVENTOR(S) : Dennis J. Buckland

It is certified that error appears in the above-identified patent and that said Letters Patent is hereby corrected as shown below:

Column 7, line 26, change "out3" to --Out3--.

Column 7, line 48, after "under" insert --the--.

Column 8, line 23, change "comparators" to --comparator--.

Column 8, line 60, change "linearily" to --linearly--.

Column 8, line 62, change "a" to --an--.

Column 8, line 65, change "principal" to --principle--.

Signed and Sealed this

Twenty-first Day of July, 1992

Attest:

DOUGLAS B. COMER

*Attesting Officer*  *Acting Commissioner of Patents and Trademarks*